(12) United States Patent
Green et al.

(10) Patent No.: US 7,158,380 B2
(45) Date of Patent: Jan. 2, 2007

(54) HEATSINK FOR DIGITAL VIDEO RECORDER

(75) Inventors: Phillip S. Green, Buford, GA (US); Dennis L. Jesensky, Lawrenceville, GA (US); Robert B. Disney, Dacula, GA (US); Roger C. Barbour, Gainesville, GA (US); Bradford Rogers, Suwanee, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 10/907,247

(22) Filed: Mar. 25, 2005

(65) Prior Publication Data

US 2006/0215357 A1    Sep. 28, 2006

(51) Int. Cl.
*H05K 7/20* (2006.01)

(52) U.S. Cl. ............... 361/704; 361/690; 361/714; 165/185

(58) Field of Classification Search ............... 361/685, 361/687, 704, 719; 174/16.1, 16.3; 165/80.3, 165/185
See application file for complete search history.

(56) References Cited

U.S. PATENT DOCUMENTS

| | | | |
|---|---|---|---|
| 5,510,954 A * | 4/1996 | Wyler | 361/685 |
| 5,671,120 A * | 9/1997 | Kikinisi | 361/687 |
| 5,927,386 A * | 7/1999 | Lin | 165/80.3 |
| 6,088,221 A * | 7/2000 | Bolognia | 361/685 |
| 6,434,000 B1 * | 8/2002 | Pandolfi | 361/685 |
| 6,567,360 B1 * | 5/2003 | Kagawa | 720/609 |
| 6,584,128 B1 | 6/2003 | Kroeger | 372/34 |
| 6,798,656 B1 * | 9/2004 | Lin | 361/690 |
| 6,980,437 B1 * | 12/2005 | Bright | 361/704 |

* cited by examiner

*Primary Examiner*—Boris Chervinsky

(57) ABSTRACT

A heat sink assembly for cooling a DVR enabled set-top box. A heat sink is coupled to a chassis of the set-top box as well as to a storage device within the chassis. Heat is transferred from the storage device to the exterior of the chassis to be vented to the exterior environment surrounding the set-top box.

20 Claims, 4 Drawing Sheets

HEATSINK FOR DIGITAL VIDEO RECORDER

TECHNICAL FIELD

The present invention relates to set-top boxes and, more particularly, relates to lengthening the life of hard drives within a set-top box by removing heat from within the set-top box.

BACKGROUND OF THE INVENTION

Broadband communications systems, such as satellite and cable television systems, are now capable of providing many services in addition to analog broadcast video. In implementing enhanced programming, the set-top box (STB) has become an important computing device for accessing various video services. In addition to supporting traditional analog broadcast video functionality, many STBs now also provide other functionality, such as, for example, an interactive program guide (IPG), picture-in-picture (PIP) viewing, video-on-demand (VOD), subscription video-on-demand (SVOD) and functionality traditionally associated with a conventional computer, such as e-mail.

Recently new functionality has been added to conventional STBs—namely the ability to record an incoming video stream in digitized form onto a mass storage device, such as a hard disk drive, and play back that recorded video as desired by the user. This functionality has become known as a "digital video recorder" (DVR) or personal video recorder (PVR) and is viewed as a superior alternative to conventional video tape recorders for capture and subsequent playback of programming content.

However, the utilization of a hard drive within a STB has resulted in an increased STB failure rate. One of the reasons for the failures is because of the heat generated within the STB which reduces the life of the hard drive. Once the hard drive fails, the entire STB needs to be replaced resulting in increased costs to the cable operator.

Computer manufactures typically strategically suspend a hard drive within a computer chassis so that the hard drive is surrounded by air. A fan is then included to keep the hard drive cool. However, the operation of the fan within the computer is audible to the user. Therefore, the use of such a fan in order to keep a hard drive cool within a STB may at times be unacceptable because the increased fan noise may disturb the subscriber's viewing experience. Therefore, what is needed is an alternative way to distribute heat from the interior to the exterior of DVR enabled STBs without requiring the use of a cooling fan.

BRIEF DISCRIPTION OF THE DRAWINGS

DETAILED DESCRIPTION

The present invention will be described more fully hereinafter with reference to the accompanying drawings in which like numerals represent like elements throughout the several figures, and in which an exemplary embodiment of the invention is shown. This invention may, however, be embodied in many different forms and should not be construed as being limited to the embodiments set forth herein; rather, the embodiments are provided so that this disclosure will be thorough and complete, and will fully convey the scope of the invention to those skilled in the art. The present invention is described more fully hereinbelow.

Figure 1:
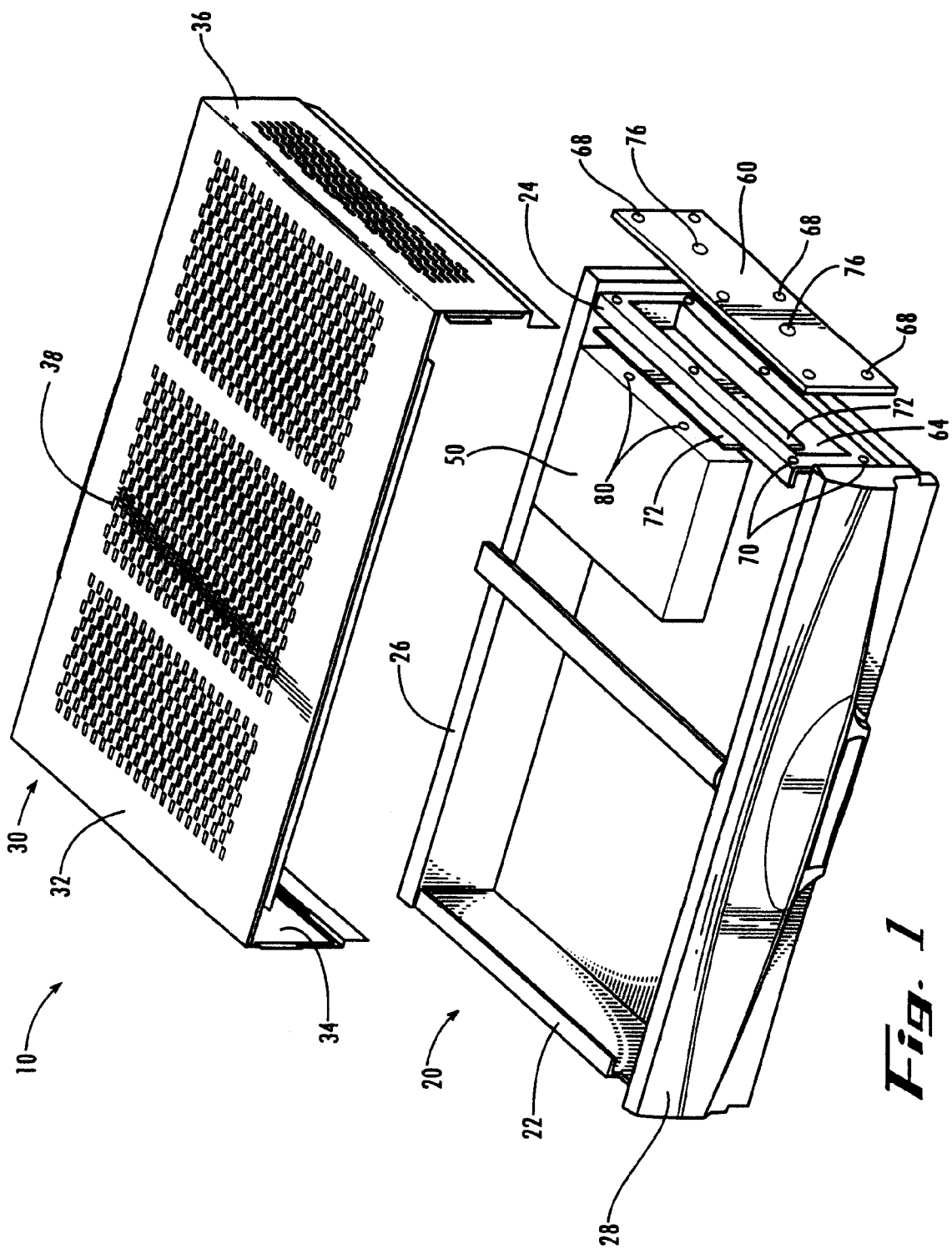
FIG. 1 illustrates an exploded front perspective view of one embodiment of a DVR enabled STB according to the present invention.

FIG. 1 illustrates one embodiment of a STB 10 according to one embodiment of the present invention. The STB 10 includes a chassis 20, typically made of steel, and a top cover 30 which define an enclosure. The chassis 20 typically includes opposite side portions 22 and 24 and back portion 26 which are substantially vertically oriented. A non-metal front face panel 28 is typically coupled to the front of the chassis 20 which, in combination with side portions 22, 24 and back portion 26, define a housing for components typically within STBs.

The top cover 30 typically includes a top portion 32 and side portions 34 and 36. The top cover 30 is configured to fit over the top of the chassis 20 so that the top cover 30's side portions 34, 36 correspond with the side portions 22, 24 of the chassis 20 with the side portions 34, 36 of the top cover 30 on the exterior of the STB 10. The chassis 20, as well as the top cover 30, typically include an air outlet such as a plurality of openings 38 to vent warmer air created from electronics internally within the STB 10 to the exterior of the STB 10 while the STB 10 is operating. As best shown in FIG. 1, the top of the top cover 30, as well as the vertical side 36, include openings 38.

For example, some of the internal electronics the STB 10 may have is a tuner system that preferably includes at least two tuners and at least one RF transmitter so that the STB 10 can transmit an independent signal to a remote STB (not shown) when used in a multi-room environment. The received signal is forwarded to a signal processing system that includes a CPU, memory, an operating system, and the DVR application in addition to one or more other software and/or hardware modules to demodulate and decode the filtered signal. The signal processing system includes a decryptor for decrypting the selected television signal and providing it in the clear to a television. The signal processing system also includes an encryptor. The subscriber may decide to record the instance decrypted by the decryptor to a storage device 50 which must then be re-encrypted by the encryptor. The storage device 50 is preferably an internal hard drive sized to hold the desired amount of recorded programming.

Figure 2:
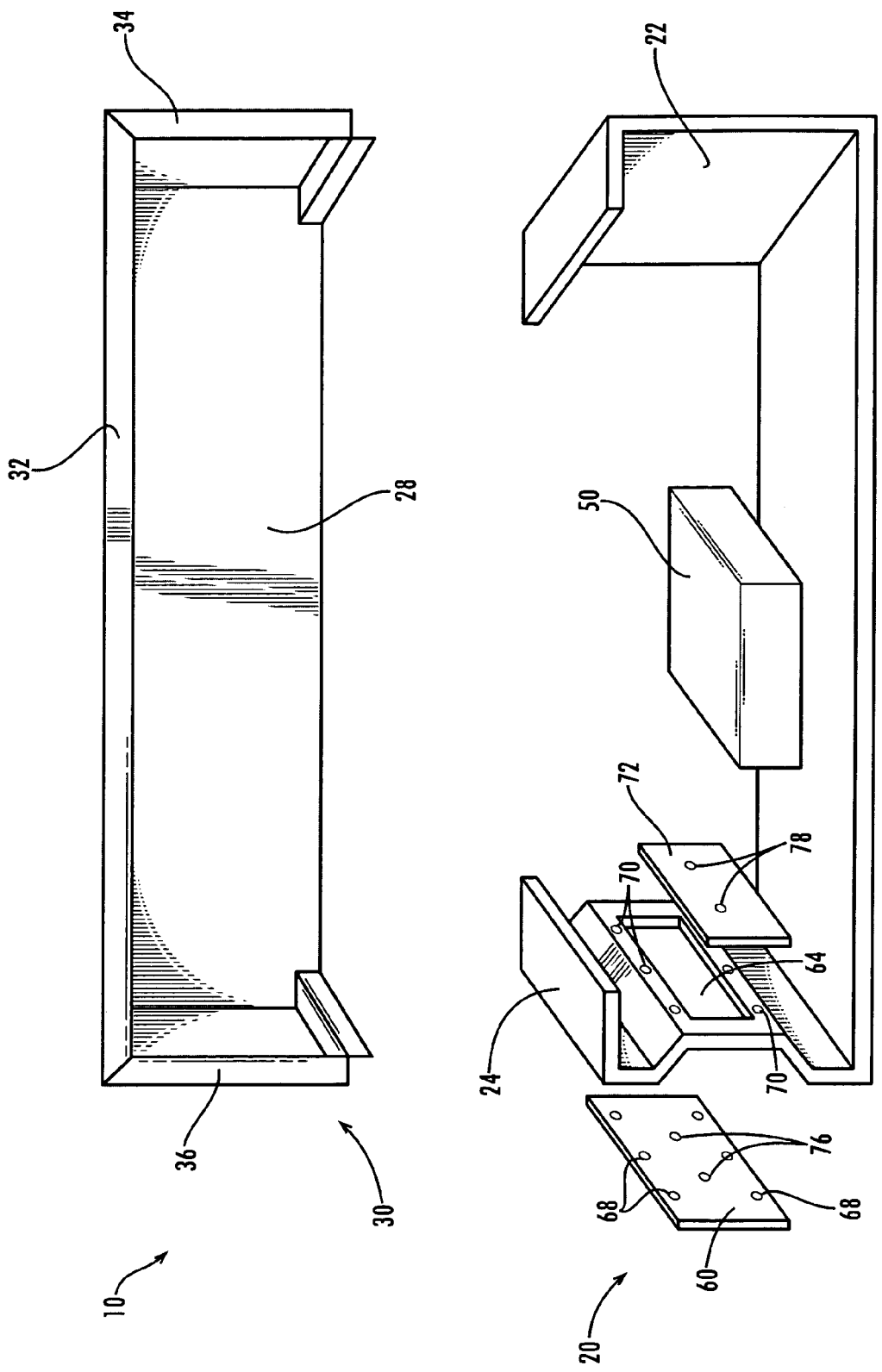
FIG. 2 illustrates an exploded rear view of one embodiment of a DVR enabled STB having a hard drive adapted to be coupled to a heat sink according to the present invention.
Figure 3:
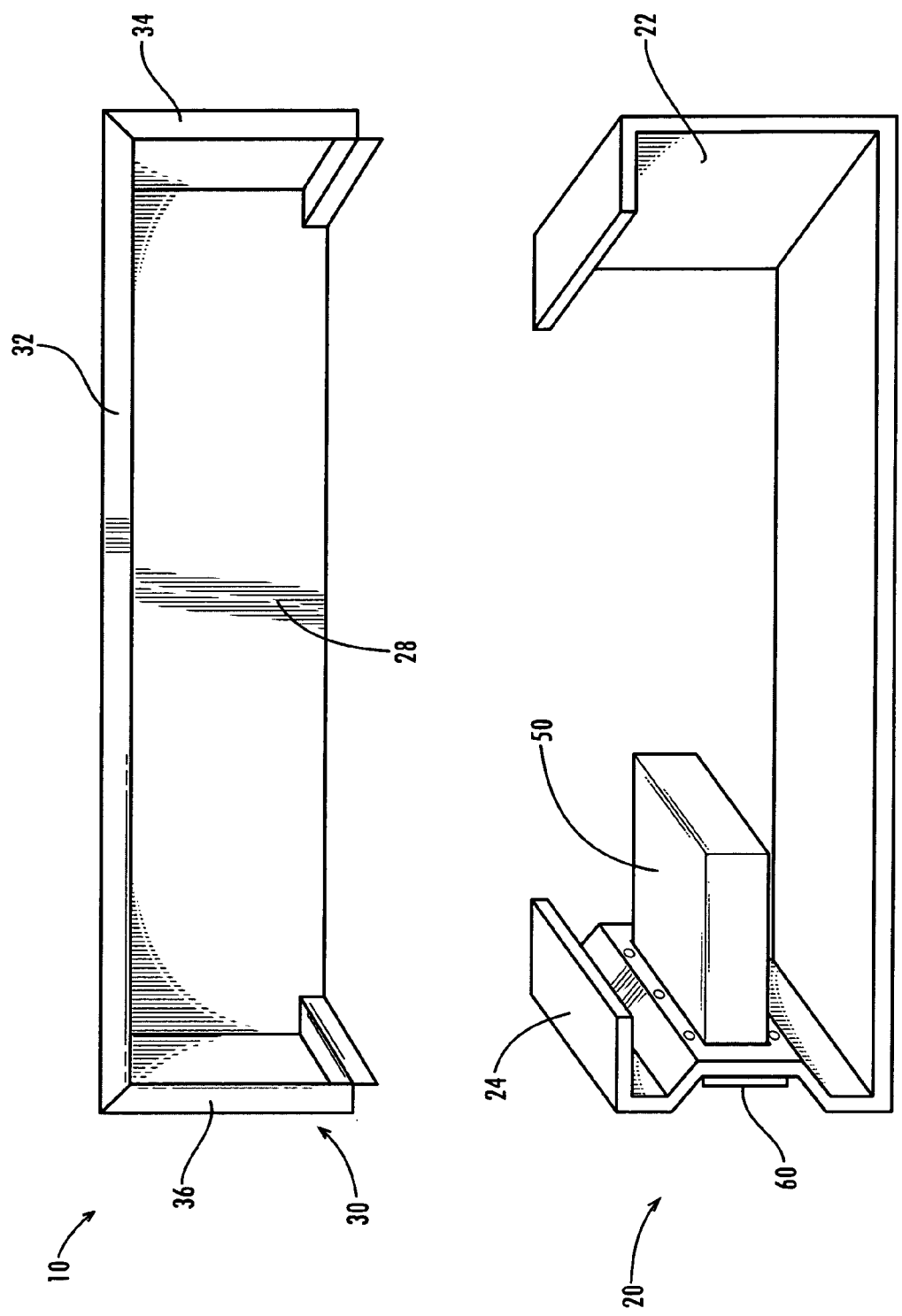
FIG. 3 illustrates the STB of FIG. 2 with the hard drive coupled to the heat sink and chassis of the STB.

FIGS. 2 and 3 best illustrate a heat sink assembly for removing heat from around the hard drive 50 of the STB 10 according to one embodiment of the present invention. FIG. 3 is an exploded view of the assembly shown in FIG. 4. Heat is transferred from the hard drive 50 to a heat sink 60. Preferably, the heat sink 60 is a material such as aluminum that has high thermal conductivity and is sized to expose a large surface area to the exterior of the chassis 20. The hard drive 50 is coupled to the heat sink 60, as shown in FIG. 3, to keep the hard drive 50 from overheating by absorbing its heat and dissipating it into the air outside of the chassis 20. Preferably, the side portion 24 of the chassis 20 defines an opening 64 therethrough which permits a side of the hard drive 50, on the interior of the chassis 20, to be secured to the heat sink 60. The heat sink 60 is positioned in between the chassis 20 and the top cover 30 when the STB 10 is assembled.

Figure 4:
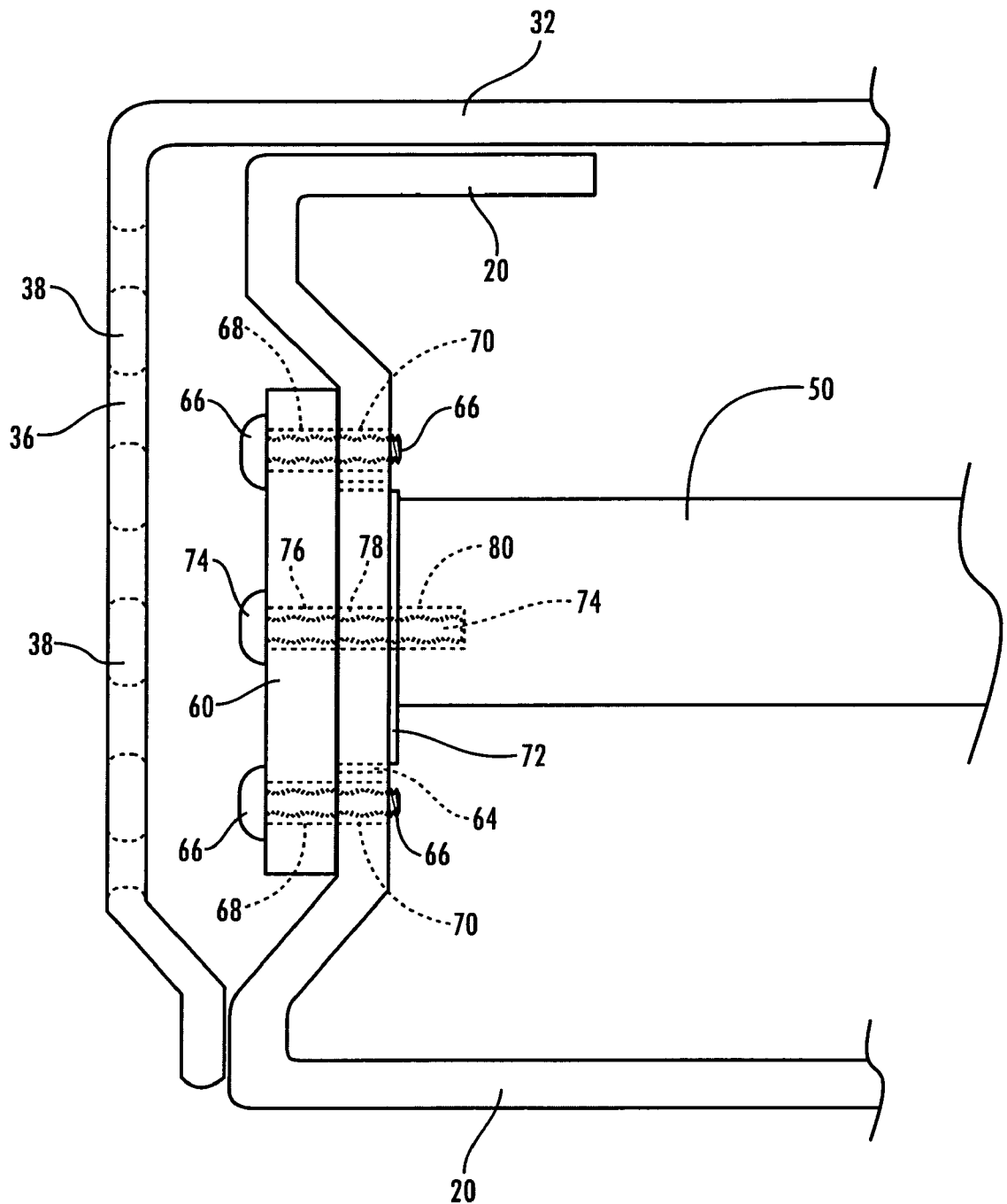
FIG. 4 illustrates a close-up view of the heat sink design according to one embodiment of the present invention.

As best shown in FIG. 4, the side portion 24 of the chassis 20 is preferably configured to define an inwardly recessed portion or cavity for receiving the heat sink 60 on the outside or the exterior of the chassis 20 without expanding the overall dimensions of the chassis 20 and to accommodate the top cover 30 without obstructing the top cover 30 when the STB 10 is assembled. The inwardly recessed portion also allows for an air space between the heat sink 60 coupled to the chassis 20 and the interior of the side portion 36 of the top cover 30 when the STB 10 is completely assembled. The heat dissipated from the heat sink 60 is dissipated into the air space between the chassis and top cover 30. The air space also allows the top cover 30 to remain cool to the touch. As a result of the use of the heat sink 60, approximately 10 degrees Celsius or more may be transferred from the hard drive 50 to less thermally sensitive areas of the STB 10. The heat displaced from the heat sink 60 is vented to the exterior environment surrounding the STB 10 by the openings 38 in the side portion 36 of the top cover 30.

Still referring to FIG. 4, the heat sink 60 is preferably held in place in the cavity on the side portion 24 of the chassis 20 by fasteners 66 which pass through openings 68 in the heat sink 60 itself to corresponding openings 70 in the chassis 20 for receiving and retaining the fasteners 66. By attaching the heat sink 60 to the chassis 20 that has a lower ambient temperature, heat is more efficiently driven into the heat sink 60. As explained above, the hard drive 50 is secured to the heat sink 60 through the opening 64 in the side portion 24 of the chassis 20. Preferably, a thermally conductive material 72, such as grease or what is commonly referred to as a thermally conductive seal pad, create a heat transferring seal between the hard drive 50 and the heat sink 60 through the opening 64 in the side portion 24 of the chassis 20. The seal pad preferably conforms to the shape and size of the side of the hard drive 50 to be coupled to the heat sink 60. In an alternative embodiment, the heat sink 60 may instead be coupled to the top, bottom or back of the hard drive 50 with the thermally conductive material 72 in between. The hard drive 50 may be secured to the heat sink 60 by fasteners 74 which pass through openings 76 in the heat sink 60 and openings 78 in the thermally conductive material 72 to corresponding openings 80 in the hard drive 50 for receiving and retaining the fasteners 74. However, the hard drive 50 may also be secured elsewhere to the chassis 20.

The heat sink 60 of the present invention is preferably a passive heat sink in that a fan may not be utilized to cool the hard drive 50 or to facilitate airflow to the exterior of the STB 10. However, some STBs may require more cooling and, therefore, the heat sink 60 may become an active heat sink with the use of a cooling fan.

The foregoing has broadly outlined some of the more pertinent aspects and features of the present invention. These should be construed to be merely illustrative of some of the more prominent features and applications of the invention. Other beneficial results can be obtained by applying the disclosed information in a different manner or by modifying the disclosed embodiments. Accordingly, other aspects and a more comprehensive understanding of the invention may be obtained by referring to the detailed description of the exemplary embodiments taken in conjunction with the accompanying drawings, in addition to the scope of the invention defined by the claims.

What is claimed is:

1. An assembly for regulating temperature of a storage device within an enclosure, said assembly comprising:

a heat sink coupled to a chassis and said chassis at least partially defining said enclosure, wherein said heat sink is sized to be received within an inwardly recessed portion of a portion of said chassis; and a thermally conductive material positioned in between said heat sink and said storage device.

2. The assembly of claim 1 wherein an opening is defined in said chassis and said heat sink and said storage device are coupled to one another through said opening in said chassis.

3. The assembly of claim 1 wherein said heat sink is coupled to an exterior of said chassis and said storage device is positioned on an interior of said chassis.

4. The assembly of claim 1 wherein said heat sink of said assembly is positioned between a top cover and said chassis of said enclosure.

5. The assembly of claim 1 wherein said heat sink is coupled to said chassis such that heat dissipating from said heat sink is vented to the exterior environment surrounding said enclosure.

6. The assembly of claim 1 wherein an air space is defined between an interior of said enclosure and said chassis for receiving heat dissipated from said heat sink.

7. The assembly of claim 1 wherein said thermally conductive material is a thermal pad.

8. The assembly of claim 1 without having a cooling fan.

9. A set-top box comprising:

a top cover and a chassis for defining an enclosure;

a storage device housed within said enclosure;

an outlet to vent air from within said enclosure to the exterior environment surrounding said set-top box; and a heat sink coupled to said storage device, wherein said chassis comprises a substantially vertically oriented portion, said portion of said chassis having an inwardly recessed portion to receive said heat sink.

10. The set-top box of claim 9 wherein said heat sink is coupled to said chassis.

11. The set-top box of claim 10 wherein said heat sink is coupled to an exterior of said chassis.

12. The set-top box of claim 9 wherein said heat sink is coupled between said chassis and said top cover.

13. The set-top box of claim 9 wherein a side portion of said chassis includes an opening therethrough, said storage device and said heat sink coupled to one another through said opening in said side portion of said chassis.

14. The set-top box of claim 9 further comprising a thermally conductive material positioned in between said storage device and said heat sink when coupled to one another.

15. The set-top box of claim 9 wherein said top cover is coupled to said chassis with said heat sink positioned in between said chassis and said top cover such that heat dissipating from said heat sink is vented through said outlet.

16. The set-top box of claim 9 wherein said outlet comprises a plurality of openings defined in said top cover.

17. The set-top box of claim 9 wherein said heat sink and said storage device are coupled to one another and wherein said heat sink and said storage device are positioned on opposite sides of a portion of said chassis.

18. The set-top box of claim 9 wherein said heat sink is coupled to said chassis such that heat dissipating from said heat sink is vented to the exterior environment surrounding said set-top box.

19. The set-top box of claim 9 wherein an air space is defined between an interior of said top cover and said chassis for receiving heat dissipated from said heat sink.

20. The set-top box of claim 9 free from using a cooling fan.

* * * * *

UNITED STATES PATENT AND TRADEMARK OFFICE
CERTIFICATE OF CORRECTION

PATENT NO. : 7,158,380 B2 Page 1 of 1
APPLICATION NO. : 10/907247
DATED : January 2, 2007
INVENTOR(S) : Green et al.

It is certified that error appears in the above-identified patent and that said Letters Patent is hereby corrected as shown below:

On the Title page, item [75]:
Inventor name: Change: "Phillip" to --Philip--

Signed and Sealed this

Third Day of April, 2007

JON W. DUDAS
*Director of the United States Patent and Trademark Office*